US012701816B2

(12) United States Patent
Hofmann et al.

(10) Patent No.: US 12,701,816 B2
(45) Date of Patent: Aug. 4, 2026

(54) METHOD FOR PRODUCING A SOLAR CELL

(71) Applicants: Fraunhofer-Gesellschaft zur Forderung der angewandten Forschung e.V., Munich (DE); Ultra High Vacuum Solutions Ltd, Dublin (IE)

(72) Inventors: Marc Hofmann, Freiburg (DE); Sebastian Mack, Freiburg (DE); Bishal Kafle, Freiburg (DE); Jochen Rentsch, Freiburg (DE); Nabeel Wahab Khan, Freiburg (DE); Laurent Clochard, Dublin (IE); Edward Duffy, Dublin (IE)

(73) Assignees: Fraunhofer-Gesellschaft zur Förderung der angewandten Forschung e.V., Munich (DE); Ultra High Vacuum Solutions Ltd, Dublin (IE)

( * ) Notice: Subject to any disclaimer, the term of this patent is extended or adjusted under 35 U.S.C. 154(b) by 382 days.

(21) Appl. No.: 18/356,879

(22) Filed: Jul. 21, 2023

(65) Prior Publication Data

US 2023/0361237 A1     Nov. 9, 2023

Related U.S. Application Data

(63) Continuation of application No. PCT/EP2022/051446, filed on Jan. 24, 2022.

(30) Foreign Application Priority Data

Jan. 25, 2021     (DE) .......................... 102021200627.2

(51) Int. Cl.
*H10F 10/00*     (2025.01)
*H10F 10/165*     (2025.01)
*H10F 71/00*     (2025.01)

(52) U.S. Cl.
CPC ......... *H10F 71/121* (2025.01); *H10F 10/165* (2025.01)

(58) Field of Classification Search
CPC .... H10F 71/121; H10F 10/165; H10F 10/166; H01L 21/32135
(Continued)

(56) References Cited

U.S. PATENT DOCUMENTS

2003/0095911 A1*   5/2003   Ohashi .................... C01B 32/00
                                                    423/416
2010/0288330 A1*  11/2010   Riva ...................... H10D 86/60
                                                    216/24

(Continued)

FOREIGN PATENT DOCUMENTS

JP        2003-101051 A      4/2003
KR      10-2015-0124292     11/2015
KR      10-2016-0097926      8/2016

OTHER PUBLICATIONS

International Search Report and Written Opinion received for Application No. PCT/EP2022/051446 mailed May 11, 2022 (15 pages).

(Continued)

*Primary Examiner* — Sheikh Maruf
(74) *Attorney, Agent, or Firm* — Hussey IP, LLC

(57)     ABSTRACT

The embodiments relate to a method for producing a solar cell having a rear-side contact with a tunnel barrier. A monocrystalline wafer having a front side and a rear side may be provided with silicon and a dopant. A tunnel barrier is produced on the wafer, and a polycrystalline or amorphous layer is deposited on the tunnel barrier. The polycrystalline or amorphous layer includes silicon and a dopant. The polycrystalline or amorphous layer is removed on the front side by gas-phase etching.

15 Claims, 5 Drawing Sheets

(58) Field of Classification Search
USPC ........................................................... 438/57
See application file for complete search history.

(56) References Cited

U.S. PATENT DOCUMENTS

| | | | | | |
|---|---|---|---|---|---|
| 2013/0247965 | A1* | 9/2013 | Swanson | ................. | H10F 10/14 |
| | | | | | 257/E31.13 |
| 2014/0042539 | A1* | 2/2014 | Hwang | ................ | H10D 30/031 |
| | | | | | 438/162 |
| 2014/0096821 | A1* | 4/2014 | Chen | ........................ | H10F 77/14 |
| | | | | | 438/96 |
| 2014/0360571 | A1* | 12/2014 | Ji | .......................... | H10F 77/219 |
| | | | | | 136/258 |
| 2016/0268454 | A1* | 9/2016 | Gwon | ................... | H10F 10/167 |
| 2016/0315140 | A1* | 10/2016 | Iwasaki | ................ | H10D 62/109 |
| 2017/0200845 | A1* | 7/2017 | King | ...................... | H10F 77/48 |
| 2018/0047830 | A1* | 2/2018 | Lu | ...................... | H10D 30/0314 |
| 2018/0269118 | A1* | 9/2018 | Matsui | ............. | H01J 37/32449 |
| 2019/0097078 | A1* | 3/2019 | Geerligs | .............. | H10F 10/146 |
| 2019/0115225 | A1* | 4/2019 | Ting | ................. | H01L 21/32135 |
| 2019/0206694 | A1* | 7/2019 | Takahashi | .............. | H10D 1/716 |
| 2019/0326401 | A1* | 10/2019 | Kolev | ................ | H10D 30/6711 |
| 2019/0334030 | A1* | 10/2019 | Takeuchi | ............. | H10D 30/668 |
| 2019/0341268 | A1* | 11/2019 | Zhang | ................... | H10D 64/667 |
| 2020/0098624 | A1* | 3/2020 | Narushima | ......... | C23C 16/0236 |
| 2020/0168470 | A1* | 5/2020 | Han | ................... | H01L 21/31056 |
| 2020/0350414 | A1* | 11/2020 | Lee | ...................... | H10D 64/017 |
| 2021/0202783 | A1* | 7/2021 | Wu | ........................ | H10F 77/311 |
| 2021/0280730 | A1* | 9/2021 | Khan | .................... | H10F 10/162 |
| 2022/0254645 | A1* | 8/2022 | Luan | ................... | H01L 21/3065 |
| 2022/0301854 | A1* | 9/2022 | Horita | ............... | C23C 16/45523 |
| 2022/0301887 | A1* | 9/2022 | Kazem | .............. | H01L 21/28568 |
| 2023/0253520 | A1* | 8/2023 | Yang | .................... | H10F 10/165 |
| | | | | | 136/244 |

OTHER PUBLICATIONS

Kafle, Bishal et al., "Atmospheric Pressure Dry Etching of Polysilicon Layers for Highly Reverse Bias-Stable TOPCon Solar Cells", SOLAR RRL, 2100481, Sep. 12, 2021 ; pp. 1-9, XP055916418 (9 pp.).

Kafle, Bishal et al., "On the Formation of Black Silicon Features by Plasma-Less Etching of Silicon in Molecular Fluorine Gas", NANOMATERIALS, Bd. 10, Nr. 11, 2214, Nov. 6, 2020; pp. 1-16, XP055916431 (16 pp.).

Wang, Qinqin et al., "Study on the cleaning process of n+-poly-Si wraparound removal of TOPCon solar cells" Solar Energy, Elsevier, Amsterdam, NL, Bd. 211, Oct. 3, 2020; pp. 324-335, XP086359294 (12 pp.).

* cited by examiner

METHOD FOR PRODUCING A SOLAR CELL

CROSS-REFERENCE TO RELATED APPLICATIONS

This application claims priority as a Continuation of PCT/EP2022/051446, filed on Jan. 24, 2022, which claims priority to German Patent Application No. 10 2021 200 627.2 filed Jan. 25, 2021, the entirety of both applications are incorporated herein by reference.

FIELD

The embodiments relate to a method for producing a solar cell having a rear-side contact with a tunnel barrier, comprising the steps of: providing a monocrystalline wafer having a front side and a rear side, the wafer containing or consisting of silicon and a dopant, producing a tunnel barrier on the wafer, depositing a polycrystalline or amorphous layer on the tunnel barrier, the polycrystalline or amorphous layer containing or consisting of silicon and a dopant, and removing the polycrystalline or amorphous layer on the front side. Solar cells made in this way are known as tunnel passivated contact solar cells (TOPcon solar cell).

BACKGROUND

In high-efficiency solar cells, the metallic rear-side contacts limit the efficiency. In order to solve this problem, it is known from Martin Hermle: "Mit neuen Verfahren näher an die ideale Solarzelle", www.bine.info/Projektinfo_13_2017 to carry out the rear-side contact as a multilayer system. For this purpose, a tunnel barrier made of an oxide is applied directly to the rear side of the substrate forming the solar cell. Polycrystalline or amorphous silicon is deposited on this tunnel barrier. The polycrystalline or amorphous silicon can further optionally contain a dopant. A metal contact is again produced on this polycrystalline or amorphous silicon. The rear-side contact produced in this way allows, on the one hand, low-loss transport of the majority charge carriers. On the other hand, the recombination of charge carriers at the rear-side contact is suppressed.

However, the disadvantage of these solar cells is the complex production thereof. The layer of polycrystalline or amorphous doped silicon is usually produced by low-pressure synthesis using chemical vapor deposition. However, the result is that both the front and rear sides of the wafer are coated. Therefore, the polycrystalline or amorphous doped silicon must be removed again from the front side. This is done according to the prior art by means of wet chemical etching in HF and/or HNO3 and/or an alkaline solution. However, this also etches the layer on the rear side and, in some cases, the tunnel barrier so that the yield of functional cells is low.

On the basis of the prior art, the object of the embodiments is to provide a method for producing the rear-side contact of a TOPcon solar cell, which method reliably leads to predictable results.

According to the embodiments, this object is achieved by a method according to claim 1. Advantageous further developments of the embodiments can be found in the subclaims.

According to the embodiments, it is proposed to use a preferably monocrystalline wafer for the production of a solar cell having a rear-side contact with a tunnel barrier. The wafer can consist of monocrystalline silicon or contain monocrystalline silicon. The wafer can be made by sawing it from an ingot. The wafer can have a thickness from about 50 μm to about 200 μm or from about 60 μm to about 120 μm. The wafer can optionally contain a dopant that brings about a first conductivity. The first conductivity can be, for example, n-type conductivity. For this purpose, the dopant can be selected from phosphorus, nitrogen, and/or arsenic. The wafer can be polygonal or round and can have, for example, a diameter or a circumference having a diameter from about 100 mm to about 200 or from about 150 mm to about 300 mm.

The wafer has a front side and an opposite rear side, wherein for the purposes of the present description, the front side is formed as light entry surface of the finished solar cell. The front side can be provided with an emitter containing at least one pn junction in a manner known per se. Furthermore, at least one front side contact can be provided on the front side. Optionally, the front side can be provided with reflection-reducing anti-reflection layers and/or patterning to increase the efficiency.

The rear side is provided with a rear side contact so that, when light is incident on the solar cell, an electrical voltage is generated between the front-side contact and the rear-side contact and a current can be tapped.

A tunnel barrier is made on the wafer to produce the rear-side contact. The tunnel barrier can contain an insulator or dielectric. In some embodiments of the embodiments, the tunnel barrier can be a ceramic or contain a ceramic. In particular, the tunnel barrier can be a nitride or an oxide. In some embodiments, the tunnel barrier can contain or consist of silicon oxide. The tunnel barrier can be formed by chemical vapor deposition, sputtering, or annealing the wafer in an oxidizing atmosphere. The tunnel barrier can have a thickness from about 1 nm to about 5 nm or of about 1.5 nm. Depending on the selected production process, the tunnel barrier can be produced exclusively on the rear side or on both the rear side and the front side of the wafer.

Furthermore, it is proposed according to the embodiments to deposit a polycrystalline or amorphous layer on the tunnel barrier, the polycrystalline or amorphous layer containing or consisting of at least silicon. For the purposes of the present description, a polycrystalline or amorphous layer is a layer that appears amorphous, crystalline or partially crystalline in an X-ray structure analysis. Optionally, the polycrystalline or amorphous layer can further contain a dopant. The dopant can be selected from nitrogen, phosphorus, or arsenic, and to that extent provide n-type conductivity in the polycrystalline or amorphous layer. In other embodiments, the polycrystalline or amorphous layer can further contain a dopant which is selected from boron, aluminum, or gallium, and to this extent effects p-type conductivity in the polycrystalline or amorphous layer.

The polycrystalline or amorphous layer can have a thickness from about 50 nm to about 150 nm, or from about 100 to about 120 nm, or from about 50 to about 70 nm. Preferably, the polycrystalline or amorphous layer can be produced by chemical vapor deposition, e.g. by low-pressure synthesis (LPCVD) or by plasma deposition (PECVD). In some embodiments, the polycrystalline or amorphous layer can also be deposited at atmospheric pressure (APCVD). In some embodiments, the polycrystalline or amorphous layer can be produced by vapor deposition or physical vapor deposition (PVD).

Depending on the deposition process which is used to produce the polycrystalline or amorphous layer, the polycrystalline or amorphous layer is also not formed exclusively or predominantly on the rear side of the wafer. On the contrary, an inherently undesirable deposition of the polycrystalline or amorphous layer on the front side can be unavoidable.

According to the invention, it is therefore proposed to remove the polycrystalline or amorphous layer on the front side of the wafer. According to the invention, this is done by gas-phase etching, the etchant containing or consisting of at least fluorine (F2). Completely surprisingly, it has been shown that the wafer can be exposed to an etching gas atmosphere while resting with its rear side on a holder without removing the polycrystalline or amorphous layer from the rear side. Completely surprisingly, the etchant attacks predominantly on the front side facing the open half space, although the diffusion coefficient in the gas phase is multiple orders of magnitude larger than in liquids. Nevertheless, the selectivity of the etching process is significantly improved compared to a wet chemical etching step used according to the prior art.

In some embodiments, the wafer can be brought to a temperature from about 120° C. to about 230° C., or from about 150° C. to about 260° C. for gas-phase etching. This temperature range, on the one hand, allows the wafer to be processed sufficiently fast to allow economical fabrication of the solar cell. On the other hand, the etching is slow enough to allow good controllability of the etching depth. In other embodiments, the wafer can be brought to a temperature of about 170° C. to about 220° C. for gas-phase etching. In yet another embodiment, the wafer can be heated to a temperature of about 180° C. to about 210° C. Finally, in some embodiments, the wafer can be heated to a temperature of about 190° C. to about 200° C. Here, lower temperatures allow for better control and higher temperatures allow for a faster etch rate so that, within the above limits, the process conditions can be adapted to the desired process control.

In some embodiments, the wafer can rest on a conveyor belt for gas-phase etching. The conveyor belt can be driven by a machine in some embodiments. In this way it is possible to achieve precise control of the speed and, when the length of the conveyor belt is given, precise control of the etch time so that the method according to the invention has good reproducibility.

In some embodiments, the gas-phase etching is carried out with a gas phase having a fluorine concentration of about 20 vol. % to about 30 vol. %. In other embodiments, the fluorine concentration can be about 23 vol. % to about 27 vol. %. In other embodiments, the fluorine concentration can be about 1 vol. % to about 100 vol. %. In yet another embodiment, the fluorine concentration can be about 25.7 vol. %. The remaining portions of the gas phase can form at least one inert gas, such as nitrogen and/or a noble gas.

In some embodiments, gas-phase etching can be carried out with a gas phase to which fluorine is supplied at a flow rate from about 0.1 slm to about 100 slm. In some embodiments, gas-phase etching can be carried out with a gas phase to which fluorine is supplied at a flow rate from about 3 slm to about 10 slm. In other embodiments, gaseous fluorine can be supplied at a flow rate from about 5 slm to about 7 slm. In again other embodiments, fluorine can be supplied at a flow rate from about 5.5 slm to about 6.5 slm. Here, the unit slm describes the amount of molecule flowing through the conduit cross-section per unit time and under standard conditions, i.e. a temperature corresponding to 0° C. and a pressure of 1013.25 mbar, with the following applying in SI units:

$$1 slm = 1.68875 \frac{Pa \cdot m^3}{s}$$

In some embodiments, gaseous nitrogen can be supplied to the gas phase during the gas-phase etching of the wafer at a flow rate from about 0 slm to about 100 slm. In some embodiments, gaseous nitrogen can be supplied to the gas phase during the gas-phase etching of the wafer at a flow rate from about 0.5 slm to about 1.5 slm. In other embodiments, nitrogen can be supplied at a flow rate from about 0.75 slm to about 1.25 slm. In yet another embodiment, nitrogen can be supplied at a flow rate from about 0.9 slm to about 1.1 slm.

In some embodiments, gas-phase etching can last from about 3 seconds to about 35 seconds. In some embodiments, the gas-phase etching can last between about 15 seconds and about 35 seconds. This allows for reliable removal of the polycrystalline or amorphous layer on the front side and optional patterning of the front side of the wafer. In other embodiments, the gas-phase etching can last between about 20 seconds and about 22 seconds. This allows reliable removal of the polycrystalline or amorphous layer without etching the wafer.

In some embodiments, the gas-phase etching can last between about 27 seconds and about 30 seconds. In addition to removing the polycrystalline or amorphous layer, this allows for patterning of the front side of the wafer used as the light entry surface.

In some embodiments, gas-phase etching can be carried out in a gas phase having a pressure from about 950 mbar to about 1050 mbar. In other embodiments, the gas phase can have a pressure from about 960 mbar to about 1040 mbar during gas-phase etching. In still other embodiments, the pressure during gas-phase etching can be between about 980 mbar and about 1020 mbar. Provided that the gas-phase etching is carried out at atmospheric pressure or a pressure close to atmospheric pressure, the apparatus requirements are reduced so that the method according to the invention can be easily integrated into an existing production line.

In some embodiments, gas-phase etching is terminated when the tunnel barrier is reached on the front side. It has been shown that the etch rate of silicon oxide is only about 0.012 nm/s to 0.016 nm/s, while the polycrystalline or amorphous layer is removed at an etch rate from about 17.0 nm/s to about 25 nm/s. Thus, a tunnel barrier deposited on all sides can be used on the front side as an etch stop layer and simplify the process control since the etch time tolerances that must be maintained are increased.

In some embodiments, gas-phase etching can be continued once the tunnel barrier is reached on the front side, resulting in a surface patterning on the front side of the wafer. This process control allows surface patterning that improves the absorption characteristics of the solar cell and removal of the polycrystalline or amorphous layer to be carried out in a single operational step, further simplifying the solar cell production process.

In some embodiments, the surface patterning can contain or consist of structures from about 1 µm to about 5 µm. In some embodiments, the surface patterning can contain or consist of structures from about 0.5 µm to about 1.5 µm. In some embodiments, the surface patterning can contain or consist of structures ranging from about 0.25 µm to about 1 µm. In some embodiments, the surface patterning can contain or consist of structures ranging from about 0.1 µm to about 0.4 µm. In each case, the size of the surface patterning can be determined using a scanning electron microscope. The surface patterning can here be irregular and to that extent can have a size distribution.

In some embodiments, the method can further include the steps of:

Diffusing boron into the wafer and removing the boron-containing layer on the rear side. It has been shown that by diffusing boron into a wafer, which has n-type conductivity, the pn junction that is used as an emitter can be formed in a simple manner. Due to the production process, such a pn junction is formed on both the front side and the rear side. Wet or dry chemical etching can be used to remove the unwanted pn junction on the rear side, thus preparing the rear side for the production of the rear-side contact.

Furthermore, when boron diffuses into the wafer, a borosilicate glass can be formed on the surface together with the material of the waver in some embodiments. This borosilicate glass can be removed on the rear side along with the unwanted pn junction by wet or dry chemical etching. In some embodiments, the borosilicate glass can remain on the front side of the wafer to form an additional etch stop layer in this manner. In other embodiments, the borosilicate glass can also be removed from the front side of the wafer in a wet chemical way after the removal of the polycrystalline or amorphous layer. In yet other embodiments, the borosilicate glass can also be removed wet-chemically from the front side of the wafer even before the polycrystalline or amorphous layer is deposited.

Thus, the embodiments propose two different approaches to protect the boron emitter on the front side of the solar cell during the etching of the polycrystalline or amorphous layer. One alternative is to use a thin tunnel oxide between the polycrystalline or amorphous layer and the emitter as a barrier layer. In this method, the borosilicate glass can be etched from the front side and rear side after the emitter formation process, since it is not used as a barrier layer. The other alternative is to use the borosilicate glass on the front side as a barrier layer against the attack of the F2 used as an etchant. In this case, the borosilicate glass is left on the front side but is etched on the rear side. After the polycrystalline or amorphous layer is deposited, a stack of the borosilicate glass and the polycrystalline or amorphous layer lies on the emitter on the front side. When the polycrystalline or amorphous layer is etched, this borosilicate glass now acts as a barrier layer and protects the emitter from the F2 used as an etchant.

DETAILED DESCRIPTION OF THE DRAWINGS

The invention shall be explained in more detail below by means of drawings without limiting the general concept. In these drawings.

DETAILED DESCRIPTION

Figure 1:
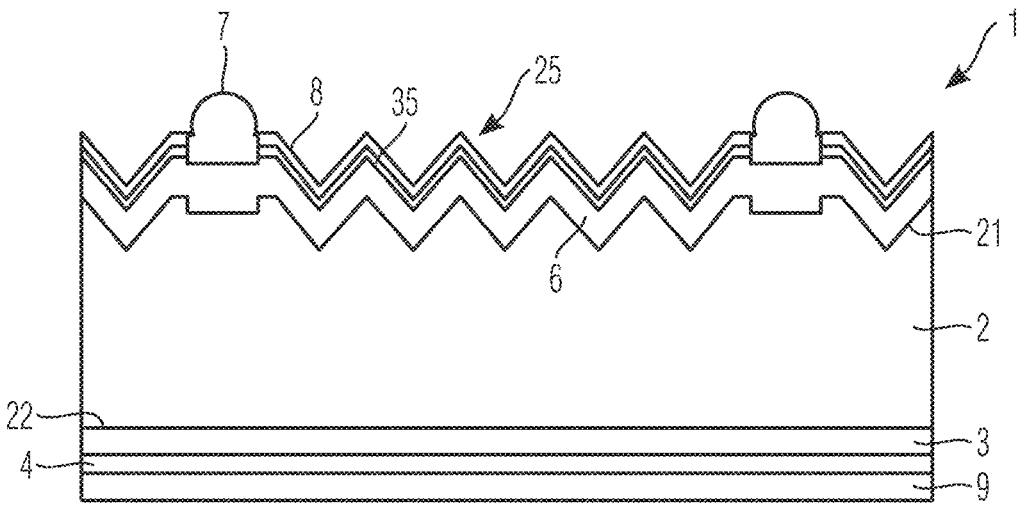
FIG. 1 shows a cross-section through a solar cell according to the embodiments.

FIG. 1 explains a solar cell according to the embodiments in more detail. The solar cell 1 consists of a wafer 2 having a front side 21 and a rear side 22. The wafer 2 can, for example, contain or consist of silicon. The wafer 2 can additionally be provided with a dopant, for example phosphorus, arsenic, antimony or bismuth. As a result, the wafer 2 can have n-type conductivity. In other embodiments, the wafer can have p-type conductivity.

The front side 21 of the wafer 2 is used as a light entry area during the intended operation of the solar cell. Therefore, to reduce reflection losses, the front side 21 has a surface patterning 25. In some exemplary embodiments, the front side 21 can have an [100] orientation, which was provided with a surface patterning by wet or dry chemical etching, which patterning comprises a plurality of pyramids, the side faces of which each have a [111] orientation.

Adjacent to the front side 21 is an emitter 6 which is substantially formed by a pn junction. The pn-junction can be formed by inward diffusion of a dopant, for example boron. For this purpose, the wafer 2 can be introduced into a boron-containing atmosphere and brought to an elevated temperature so that boron diffuses into the wafer 2 at least via the front side 21.

Furthermore, the solar cell has front side contacts 7, which can be produced in a manner known per se by screen printing, for example.

For the generation of an electrical useful voltage, a rear side contact is available, which is arranged on the rear side 22 of the wafer 2 and has a three-layer structure. The rear side contact is initially composed of a tunnel barrier 3, which contains or consists of an oxide with a larger band gap than silicon. In some embodiments, the tunnel barrier 3 can contain or consist of $SiO_x$, wherein $1 < x < 2$. This barrier is disposed directly on the rear side 22 of the wafer 2. On the tunnel barrier 3 there is a polycrystalline or amorphous layer 4, which contains or consists of silicon and a dopant, for example. On the polycrystalline or amorphous layer 4, a metal layer 9 is applied directly or by means of at least one intermediate layer, for example by PVD or CVD processes or by screen printing. In some embodiments, the intermediate layer can be deposited by CVD or PVD and the metallization can be carried out by screen printing. In some embodiments, the metallization can be applied over the entire surface. In other embodiments, the metallization can be applied in some areas, e.g. in dot or line form.

The tunnel barrier 3 can be produced, for example, by thermal oxidation or by wet or dry chemical oxidation of the wafer 2. In this way, the tunnel barrier 3 is formed not only on the rear side 22, but also on the front side 21 where it can be used as an etch stop layer 35.

The polycrystalline or amorphous layer 4 is deposited, for example, by chemical vapor deposition (CVD) or physical vapor deposition (PVD). As a result, the polycrystalline or amorphous layer 4 is also deposited in an undesirable manner on the front side 21. This layer can be removed from the front side 21 by the gas-phase etching process proposed in the embodiments quickly and above all selectively, the polycrystalline or amorphous layer 4 remaining on the rear side 22.

Figure 2:
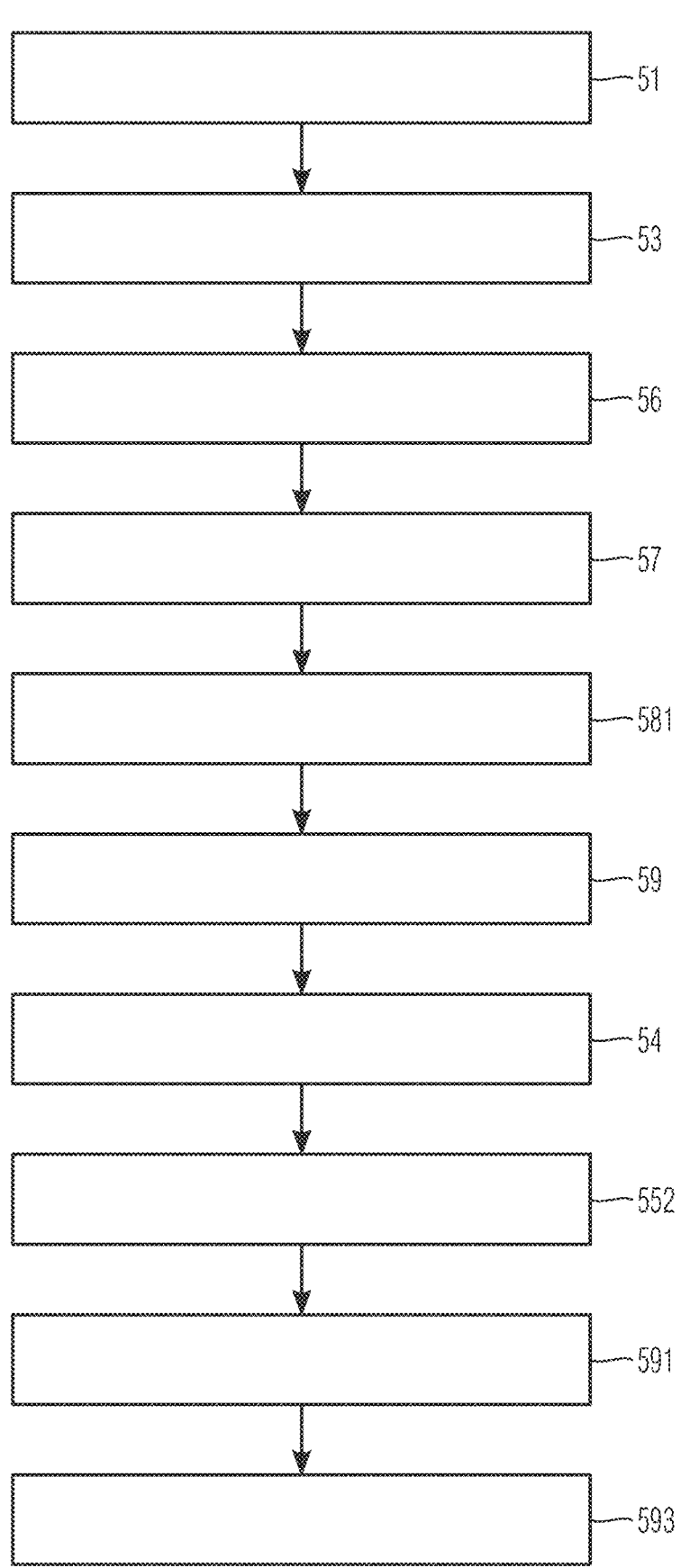
FIG. 2 shows a flow diagram illustrating a first embodiment of a method according to the embodiments.

A first embodiment of the method is explained in more detail with reference to FIG. 2, In the first method step 51, a monocrystalline silicon wafer is provided which contains a dopant, which results in n-type conductivity of the wafer. The wafer can be made from an ingot by sawing. The wafer can have a polygonal or round cross-section. A polygonal cross-section can in particular be square or octagonal. The wafer can have a diameter between about 100 mm and about 200 mm or between about 150 mm and about 300 mm or between about 200 mm and about 310 mm. In addition, the wafer can have a thickness from about 50 μm to about 150 μm or from about 50 μm to about 200 μm.

In the next method step 53, the surface defects created by the mechanical processing of the wafer 2 are removed. For this purpose, a defect-rich surface layer of the wafer can be removed by wet or dry chemical etching, for example using an alkaline solution. In some embodiments, etching can be performed in a solution of HF and HNO3. The defect-rich surface layer can have a density of about 1 μm to about 10 μm.

Then, in method step 56, the wafer is heated to an elevated temperature in an oxidizing atmosphere so that both the front side and the rear side are provided with an oxide layer. The oxide formed in method step 56 can have a thickness from about 1 nm to about 5 nm or from about 1.5 nm to about 3 nm. This oxide forms, on the rear side, the tunnel barrier of the rear side contact.

In method step 57, the wafer prepared in this manner is provided by means of LPCVD with a polycrystalline or amorphous layer, which contains silicon and a dopant. The dopant can be selected in such a way that the polycrystalline or amorphous layer has the same conductivity type as the wafer. In the exemplary embodiment shown here, the polycrystalline or amorphous layer can be doped with phosphorus, for example, to provide n-type conductivity. The polycrystalline or amorphous layer can have a thickness from about 30 nm to about 300 nm or from about 40 nm to about 150 nm. The CVD process used entails that both the front side and the rear side of the wafer are provided with the polycrystalline or amorphous layer.

In the next method step 581, the wafer is etched at a temperature of about 195° C. for about 28 seconds in a gas phase, which contains about 25.7 vol. % fluorine and the remainder being nitrogen. In this step, gaseous fluorine is supplied via a mass flow controller at a flow rate of about 6 slm. At the same time, nitrogen is supplied at a flow rate of about 1 slm. During the gas-phase etching process, the wafer rests with its rear side on a conveyor belt, which transports the wafer through the reactor used for gas-phase etching within 28 seconds.

In method step 581, the polycrystalline or amorphous layer of the illustrated exemplary embodiment is completely removed on the front side. In addition, the tunnel barrier on the front side of the wafer is also completely removed. The wafer itself is partially attacked by the gas-phase etching so that a surface patterning 25 is formed on the front side. This patterning can reduce the reflectance of the wafer so that a higher proportion of incident light is absorbed in the volume of the wafer or at the emitter when the solar cell is subsequently operated.

After the completion of the gas-phase etching, a hydrogen-rich dielectric layer, e.g. amorphous silicon nitride (SiN$_x$), is deposited on the doped silicon layer on the rear side of the wafer in method step 59. The SiN$_x$ layer increases, on the one hand, the passivation quality of the rear side by diffusion of hydrogen species to the rear-side silicon surface during the silicon-metal contact formation. On the other hand, it acts as a barrier layer against the boron atoms during the subsequent step of the boron diffusion 54.

Then, the wafer is subjected in method step 54 to a boron-containing gas atmosphere at elevated temperature. As a result, boron diffuses via the front side 21 into the wafer 2, the SiN$_x$ layer on the rear side acting as a barrier against the diffusion of boron atoms. Thus, a pn junction is formed adjacent to the front side. The pn junction adjacent to the front side is used as an emitter 6, i.e. incoming electromagnetic radiation is absorbed by the formation of electron-hole pairs which can be tapped via the front side and rear side contacts of the solar cell as electrical energy. During the boron diffusion process, the polycrystalline or amorphous silicon layer on the rear side of the wafer is also recrystallized as an optimum passivation layer. This layer is crystallized due to the high temperature budget used in the diffusion process. The undesirable layer of borosilicate glass formed on the wafer surfaces is removed in the next method step 552 by wet or dry chemical etching.

Finally, at least one optional passivation layer and/or anti-reflection layer is applied to the front side in method step 591. This layer can contain or consist of, for example, sapphire, silicon nitride and/or magnesium fluoride. These layers improve the long-term stability of the solar cell by preventing the access of atmospheric oxygen. In addition, these layers can act as optical anti-reflection layers, which improve the absorption behavior and reduce the reflectance.

Then, screen printing is used in the final method step 593 to produce a metallic rear-side contact and metallic front-side contacts.

Figure 3:
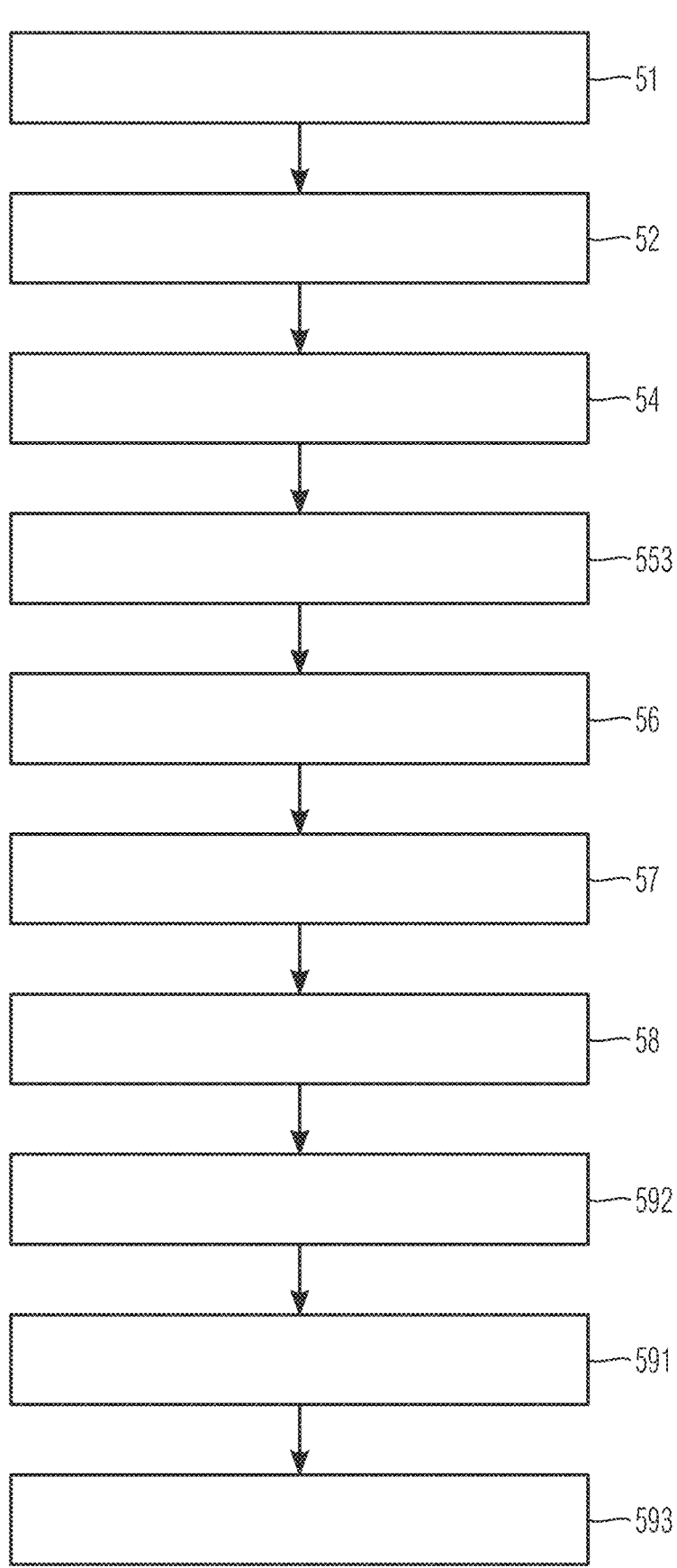
FIG. 3 shows a flow diagram illustrating a second embodiment of a method according to the embodiments.

A second embodiment of the method is explained in more detail in FIG. 3. Equal reference signs here denote equal method steps so that the following description can be limited to the essential differences.

First of all, a wafer 2 is provided, as described above, in the first method step 51.

In the second method step 52, the front side 21 is provided with a surface patterning by wet chemical etching. For this purpose, the front side 21 of the wafer 2 can have a [100] orientation, into which pyramids are introduced by etching, the side faces of which have a [111] orientation. The front side 21 patterned in this way can have a lower reflectance since light reflected at the interface between air and silicon is not reflected into the environment but at least partially impinges again on the silicon surface.

In method step 54, boron is then diffused in so that a pn junction is formed on both the front side and the rear side, as described above.

In method step 553, the pn junction is removed again from the rear side. In addition, the borosilicate glass forming from silicon and boron on the surface of the water is fully removed on both the front side and the rear side. This is also preferably done by wet or dry chemical etching. In particular the removal of the pn junction on the rear side can, however, also be carried out by laser material processing, micro-grinding or similar processes known per se.

Subsequently, in method step 56, the tunnel barrier is formed by thermal oxidation of the wafer. This is followed by the deposition of the polycrystalline or amorphous layer on the tunnel barrier, as described above. Due to the production process at least a partial coating of the front side with the tunnel barrier and the polycrystalline or amorphous layer cannot be excluded.

In the subsequent etching step 58, the wafer is positioned on a conveyor belt, the rear side resting on the conveyor belt. The wafer is then heated to 195° C. and transported within 21 seconds through the reactor which contains a gas phase composed of 25.7 vol. % fluorine and nitrogen. In this process, fluorine is supplied at a flow rate of 6 slm and nitrogen at a flow rate of 1 slm. Having completed method step 58, the polycrystalline or amorphous layer is removed on the front side and only the tunnel barrier on the front side of the wafer has at least partially remained. An attack of the etchant on the front side of the wafer was prevented by the tunnel barrier acting as an etch stop layer on the front side of the wafer. Surprisingly, the etchant does not attack the rear side of the wafer. Since it rests on the conveyor belt, the rear side is sufficiently protected from attack by the etchant.

The solar cell is finished in method steps 592, 591 and 593 by applying the passivation layers on the front side and forming the metallic contacts 7 and 9 on the front side and rear side, as described above with reference to the first exemplary embodiment. A dielectric layer, e.g. SiN$_x$, can also be deposited on the polycrystalline layer on the rear side prior to the metallization step 593.

Figure 4:
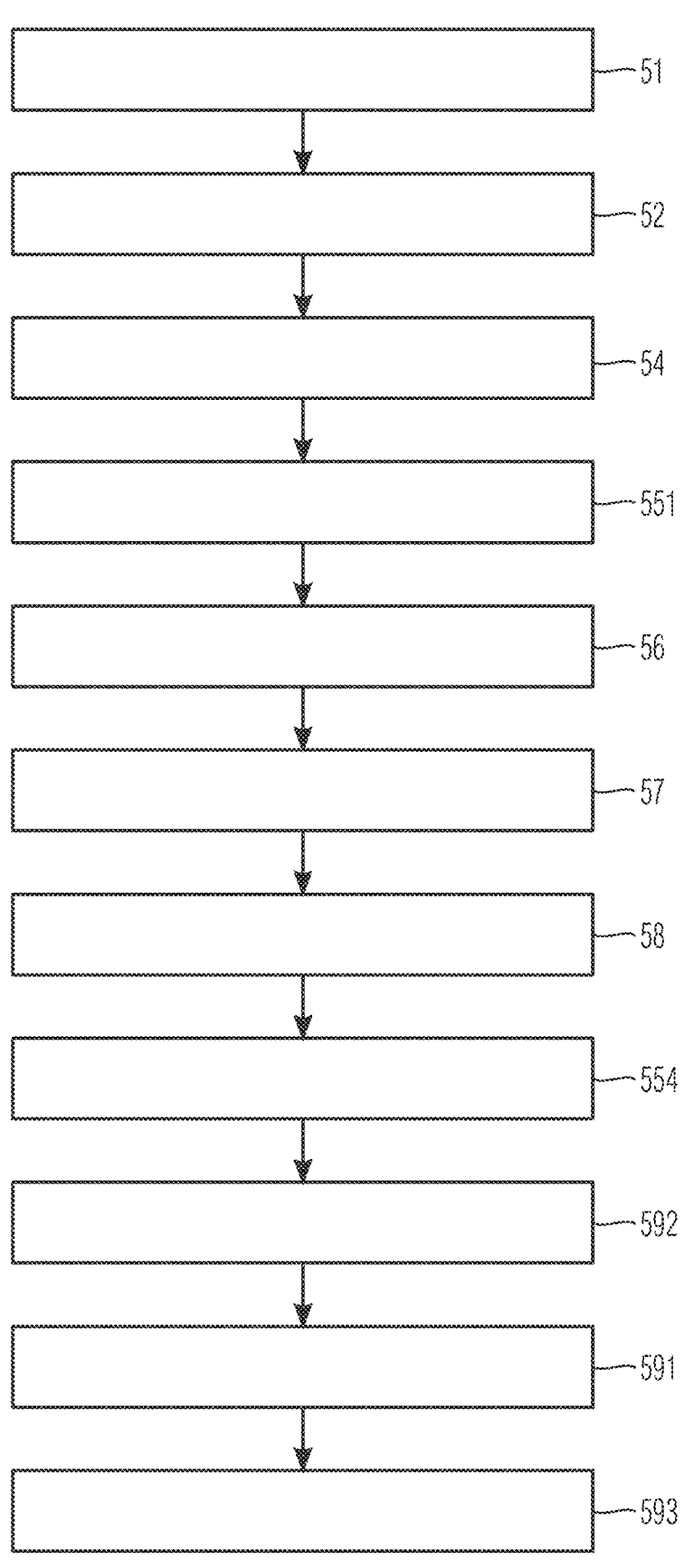
FIG. 4 shows a flow diagram illustrating a third embodiment of a method according to the embodiments.

A third alternative embodiment of the method is described with reference to FIG. 4. Also in this case, equal method steps are provided with equal reference signs so that the following description can be limited to the essential differences.

In the first method step, a wafer 2 is again provided as described above. In method step 52, this wafer is provided with a surface patterning 25 as already explained with reference to FIG. 3.

In method step 54, boron is diffused into the wafer, as described with reference to FIG. 3 in the second exemplary embodiment.

In method step 551, the pn-junction forming on the rear side is removed, as already described with reference to the second exemplary embodiment and FIG. 3. In contrast to the previously described exemplary embodiment, the borosilicate glass that is formed is removed only on the rear side together with the pn-junction. On the front side, it remains on the wafer. The borosilicate glass will later be used as an additional etch stop layer to prevent the etchant from attacking the front side 21 of the wafer 2 when removing the polycrystalline or amorphous layer.

Subsequently, in method step 56, the tunnel barrier 3 is formed by thermal generation of an SiO2 layer at least on the rear side 22, as described above. In method step 57, the polycrystalline or amorphous layer 4 is deposited on the tunnel barrier 3, again by means of an LPCVD process.

In method step 58, the polycrystalline or amorphous layer 4 is removed on the front side by gas-phase etching with fluorine, as described above.

In contrast to the second embodiment of the method described by means of FIG. 3, the borosilicate glass is now available on the front side as an etch stop layer. This prevents the etchant from attacking the material of the wafer and thus from destroying the front side and the emitter with even greater reliability. As a result, the parameters of the etching process, in particular the fluorine concentration, the temperature and the time, can be set with greater tolerances or the etching process can be carried out with greater reliability, thus increasing the yield of functional solar cells.

After removing the polycrystalline or amorphous layer, the borosilicate remaining on the front surface is removed. This can also be done by wet or dry chemical processes by selective etching so that the etching process stops automatically when it reaches the silicon surface.

As already described in the previous exemplary embodiments, the solar cell is then finished in method steps 591, 592 and 593 by producing the passivation and anti-reflection layers and applying the metallic contacts 7 and 9. In other embodiments, the sequence of the method steps can also be changed. For example, annealing can take place before the etching. When intrinsic layers are deposited, doping, for example with POCl3, can be carried out before this layer is removed on one side.

Figure 5:
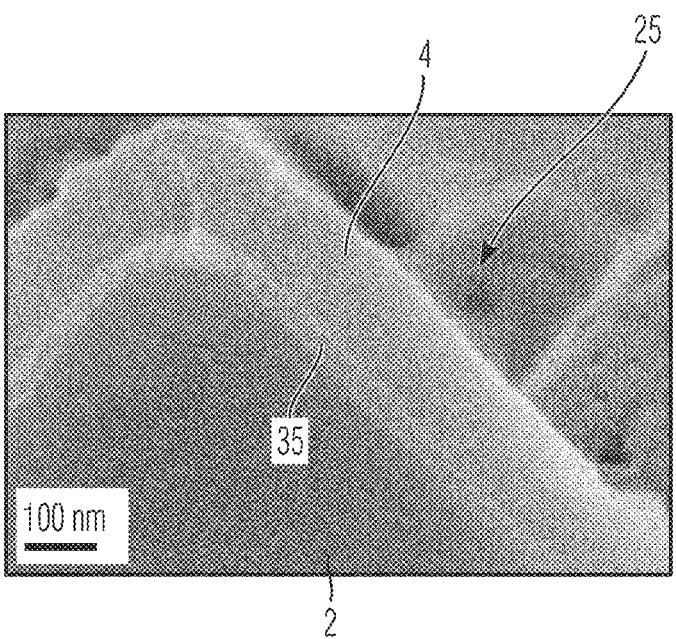
FIG. 5 shows a scanning electron micrograph of a front side of a wafer before carrying out the gas-phase etching according to the embodiments.
Figure 6:
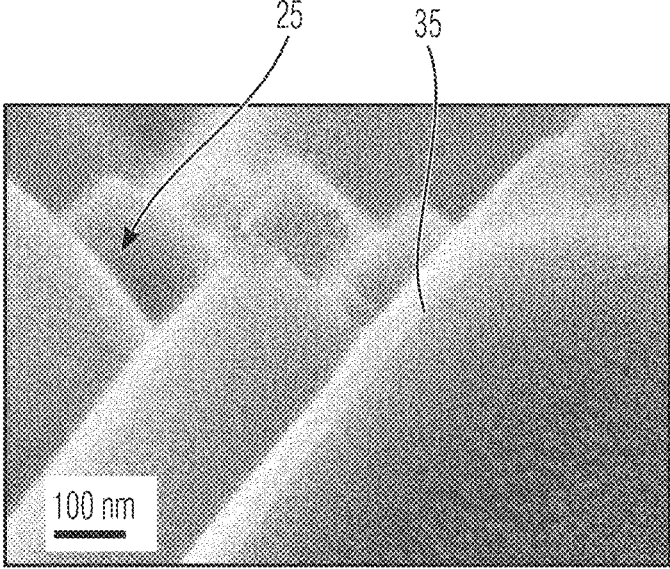
FIG. 6 shows a scanning electron micrograph of the front side of a wafer after the gas-phase etching proposed according to the embodiments.

FIGS. 5 and 6 again illustrate in more detail the effect of the method according to the embodiments. Both figures show scanning electron micrographs of the front side of wafer 2 with the surface patterning 25 produced thereon. It can be seen that the surface patterning 25 is composed of a plurality of pyramids, each of which has a [111] orientation. FIG. 5 shows the surface after the completion of step 57 according to FIG. 4 and before carrying out method step 58. FIG. 6 shows the surface after carrying out method step 58 and before carrying out method step 554.

As shown in FIG. 5, the layer of borosilicate glass which acts as etch stop layer 35 and is inevitably formed during the boron doping of wafer 2 is disposed on the silicon of wafer 2. When carrying out the method according to the second variant shown in FIG. 3, the etch stop layer 35 would be the tunnel barrier formed from SiO2.

The polycrystalline or amorphous layer 4, which contains silicon and at least one dopant, is disposed on the etch stop layer 35.

FIG. 6 shows the surface after carrying out method step 58. It can be seen that the polycrystalline or amorphous layer 4 is removed by the attack of the fluorine gas the fluorine gas (F2) used as etchant in only 21 seconds. Only the etch stop layer 35 which consists of borosilicate glass and is removed in the following method step, remains of on the surface of the wafer 2.

Of course, the invention is not limited to the illustrated embodiments. Therefore, the above description should not be regarded as restrictive but as explanatory. The following claims are to be understood in such a way that a stated feature is present in at least one embodiment. This does not exclude the presence of further features. If the claims and the above description define "first" and "second" embodiments, this designation is used to distinguish between two similar embodiments without determining a ranking order.

The invention claimed is:

1. A method for producing a solar cell having a rear-side contact with a tunnel barrier, the method comprises:
   providing a monocrystalline wafer having a front side and a rear side, the wafer comprising silicon and a dopant;
   producing a first tunnel barrier on the front side of the wafer and producing a second tunnel barrier on the rear side of the wafer;
   depositing a polycrystalline or amorphous layer on the first and second tunnel barriers, wherein the polycrystalline or amorphous layer comprises silicon; and
   removing the polycrystalline or amorphous layer on the front side by gas-phase etching, wherein an etchant for the gas-phase etching comprises F$_2$,
   wherein for the gas-phase etching, the wafer rests on a conveyor belt and
   wherein the gas-phase etching is stopped upon reaching the first tunnel barrier at the front side.

2. The method according to claim 1, wherein for the gas-phase etching, the wafer is heated to a temperature from about 120° C. to about 260° C.

3. The method according to claim 2, wherein for gas-phase etching, the wafer is heated to a temperature from about 190° C. to about 200° C.

4. The method according to claim 1, wherein the gas-phase etching is carried out with a gas phase, and the F$_2$ concentration is about 20% to about 30%.

5. The method according to claim 4, wherein the gas-phase etching is carried out with a gas phase which is supplied with F$_2$ at a flow rate from about 5 slm to about 7 slm.

6. The method according to claim 1 wherein the gas-phase etching is carried out with a gas phase which is supplied with $N_2$ at a flow rate from about 0.75 slm to about 1.25 slm.

7. The method according to claim 6, wherein the gas-phase etching is carried out between about 15 sec. and about 35 sec.

8. The method according to claim 1, wherein the gas-phase etching is carried out in a gas phase which has a pressure from about 960 mbar to about 1040 mbar.

9. The method according to claim 1, wherein the gas-phase etching is continued when reaching the tunnel barrier at the front side so that a surface patterning is produced on the front side of the wafer.

10. The method according to claim 1, further comprising:
   diffusing boron into the wafer; and
   removing the boron-containing layer on the rear side.

11. The method according to claim 10, wherein the borosilicate glass layer forming when boron is diffused on the rear side and/or on the front side of the wafer is removed in a wet chemical process.

12. The method according to claim 10, wherein the tunnel barrier has a thickness from about 1 nm to about 5 nm.

13. The method according to claim 12, wherein the polycrystalline or amorphous layer has a thickness from about 30 nm to about 300 nm.

14. The method according to claim 13, wherein the tunnel barrier comprises $SiO_x$ wherein $1 \leq x \leq 2$.

15. The method according to claim 1, wherein the polycrystalline or amorphous layer further contains at least one dopant.

\* \* \* \* \*